United States Patent
Yoon (12)

(10) Patent No.: US 6,226,215 B1
(45) Date of Patent: May 1, 2001

(54) SEMICONDUCTOR MEMORY DEVICE HAVING REDUCED DATA ACCESS TIME AND IMPROVE SPEED

(75) Inventor: Ha Ryong Yoon, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/473,698

(22) Filed: Dec. 29, 1999

(30) Foreign Application Priority Data

Dec. 30, 1998 (KR) .................................................. 98-61962

(51) Int. Cl.[7] ....................................................... G11C 8/00
(52) U.S. Cl. ................................ 365/230.03; 365/185.25; 365/203
(58) Field of Search ......................... 365/185.25, 230.03, 365/203

(56) References Cited

U.S. PATENT DOCUMENTS

| | | |
|---|---|---|
| 5,404,338 | 4/1995 | Murai et al. ........................... 365/233 |
| 5,636,174 | 6/1997 | Rao ..................................... 365/230.3 |
| 5,790,466 * | 6/2000 | Hotta ................................... 365/203 |
| 5,815,462 | 9/1998 | Konishi et al. ....................... 365/233 |
| 5,856,940 | 1/1999 | Rao ..................................... 365/149 |
| 5,862,090 * | 1/1999 | Numata et al. ....................... 365/203 |
| 5,901,109 | 5/1999 | Miura .................................. 365/233 |
| 5,909,400 | 6/1999 | Bertin et al. ......................... 365/187 |
| 5,914,902 | 6/1999 | Lawrence et al. ................... 365/201 |
| 6,081,468 * | 6/2000 | Taira et al. ........................... 365/203 |

* cited by examiner

Primary Examiner—David Nelms
Assistant Examiner—Connie C. Yoha
(74) Attorney, Agent, or Firm—Nath & Associates, PLLC; Gary M. Nath; Harold L. Novick

(57) ABSTRACT

Disclosed is a semiconductor memory device comprising a precharging unit between bit lines within a memory cell region and bit lines within a sense amplifier region, respectively. When performing a column operation on the bit lines within the sense amplifier region upon consecutive read operations, the bit lines within the memory cell region are precharged and a wordline is disabled, and thus the memory cell region comes to the ready to enable a new wordline. Accordingly, the timing of row and column operations can be reduced, thereby reducing a data access time and realizing a high speed operation.

9 Claims, 7 Drawing Sheets

SEMICONDUCTOR MEMORY DEVICE HAVING REDUCED DATA ACCESS TIME AND IMPROVE SPEED

BACKGROUND OF THE INVENTION

1. Field of the Invention

The present invention relates to a semiconductor memory device and more particularly to a semiconductor memory device capable of improving row and column operations upon consecutive read operations by changing a bit line configuration and thus reducing a data access time, thereby realizing a high speed operation.

2. Discription of the Prior Art

In general, a read operation of memory device such as DRAM can be performed in accordance with the following processes.

First, a row decoding operation is carried out for selecting one of wordlines on a cell array block by supplying address signals inputted to an address buffer when an operation control signal, /RAS, is changed to an active state to the memory device and then by decoding the supplied address signals.

Next, data on the cells connected with the selected wordline are transferred to bit lines (SL, /SL) within a sense amplifier region via a bit line separating circuit. At this time, a bit line sense amplifier 5 is activated and then amplifies signals having a very small potential difference, which were loaded on the bit lines (SL, /SL) within the sense amplifier region, to a power supply voltage VCC level and a ground voltage VSS level, respectively.

Meanwhile, a pass transistor which transfers the data of the bit line, which were amplified by the bit line sense amplifier 5, to data bus lines (DB, /DB) is switching-controlled by an output signal YI of a column decoder and thus selects one column data.

The selected column data are loaded on the data bus lines (DB, /DB) via the selectively switched pass transistor and are sensed and amplified by a data bus line sense amplifier. Then, the data bus line sense amplifier outputs the amplified data outside the device via a data output buffer and the like, thereby completing the read operation.

However, in such a conventional DRAM device which performs the read operation in accordance to the above described processes, in order that the next read operation can be formed after completing one read operation, it was possible to perform a row operation with respect to a second read command only after completing a column operation with respect to a first read command.

FIG. 1 shows a general DRAM configuration. As shown, the DRAM comprises a unit memory cell 1 consisted of a NMOS transistor NM1 and a cell capacitor C1 which store data thereon and which are connected between a first one side bit line BL1 and a cell plate voltage supply terminal VCP; a first line connecting unit 2 consisted of second and third NMOS transistors (NM2, NM3) responsive to a bit line separating signal BISH for connecting or disconnecting the first bit lines (BL1, /BL1) and sense amplifier lines (SL, /SL); a second line connecting unit 3 consisted of fourth and fifth NMOS transistors (NM4, NM5) responsive to a bit line separating signal BISL for connecting or disconnecting second bit lines (BL2, /BL2) and the sense amplifier lines (SL, /SL); a precharging unit 4 for equalizing and precharging the sense amplifier lines (SL, /SL) under a control by a bit line equalizing and precharging control signal BLP; a bit line sense amplifier connected between the sense amplifier lines (SL, /SL) for performing a bit line sensing operation; and a data bus line connecting unit 6 consisted of sixth and seventh NMOS transistors responsive to a column selecting signal YI for connecting or disconnecting the sense amplifier lines (SL, /SL) and data bus lines (DB, /DB).

FIG. 2(a) through 2(g) show timing diagrams illustrating a bit line driving of DRAM of FIG. 1. As shown in FIGS. 2(c) and 2(d) respectively, until a column operation has been completed, the bit line separating signals (BISH, BISL) and the potential of a wordline WL are still maintained at a logic high state. Therefore, both of the two signals (BISH, WL) are maintained at a switched-off state in order to perform consecutive read operations. Then, after the first bit lines (BL1, /BL1) were precharged with a predetermined potential (for example, one half of VDD potential) as shown in 2(e), a /RAS signal is again applied thereto at an enable state of a logic low level as shown in FIG. 2(a). At this time, when trying to read data by selecting new wordline, an interval tA between a delay time tRCD between the /RAS signal and a /CAS signal and a precharging time tRP by the /RAS signal becomes longer. As a result, there exists a problem that an access time is delayed, resulting in the limitation of a high-speed operation.

Such problem is occurred when the two bit line separating signals (BISH, BISL) are maintained at a power supply voltage VDD during precharging, and thus the bit lines (BL1, /BL1) within the memory cell region and sense amplifier lines (SL, /SL) within the sense amplifier region are activated at the same single node, as shown in FIG. 2(c).

Accordingly, in the conventional DRAM configuration, since the bit lines within the memory cell region and the bit lines within the sense amplifier region are not completely separated each other, the access time is delayed and thus a high-speed operation is limited when performing consecutive read operations.

SUMMARY OF THE INVENTION

Accordingly, the present invention is made in view of the above-mentioned problem, and it is an object of the present invention to provide a high-speed operating DRAM capable of reducing a data access time by separating and individually controlling bit lines with respect to a memory cell region and a sense amplifier region and thereby carrying out row and column operations at a high speed when performing consecutive read operations.

In order to achieve the above object, in accordance to the present invention, a semiconductor memory device comprising:

a unit memory cell;

a first line connecting means responsive to a first bit line separating signal for connecting or disconnecting a first bit line within the unit memory cell and bit lines within a sense amplifier region;

a second line connecting means responsive to a second bit line separating signal for connecting or disconnecting second bit lines and bit lines within the sense amplifier region;

a first precharging means for equalizing and precharging the bit lines within the sense amplifier region under a control by a first precharging control signal;

a bit line sense amplifier connected between the bit lines within the sense amplifier region for performing a bit line sensing operation under a control by sense amplifier control signals;

a data bus line connecting means responsive to a column selecting signal for connecting or disconnecting the bit lines within the sense amplifier region and data bus lines; and a second precharging means for equalizing and precharging the first bit lines within the unit memory cell region under a control by a second precharging control signal being characterized in that the semiconductor memory device;

wherein the first and second bit line separating signals are generated from a bit line separating signal generating means in accordance with a bank selecting signal and a sensing generating signal;

the first bit line precharging control signal is generated from a first precharging control means in accordance with the bank selecting signal and the first and second bit line separating signals; and the second bit line precharging control signal is generated from a second precharging control means in accordance with the bank selecting signal and a /CAS signal.

The above and other objects, features and advantages will be more apparent from the following detailed description with reference to the accompanying drawings,

DETAILED DESCRIPTION OF THE INVENTION

Now, the preferred embodiment of the present invention will be described in detail with reference to the accompanying drawings.

Figure 3:
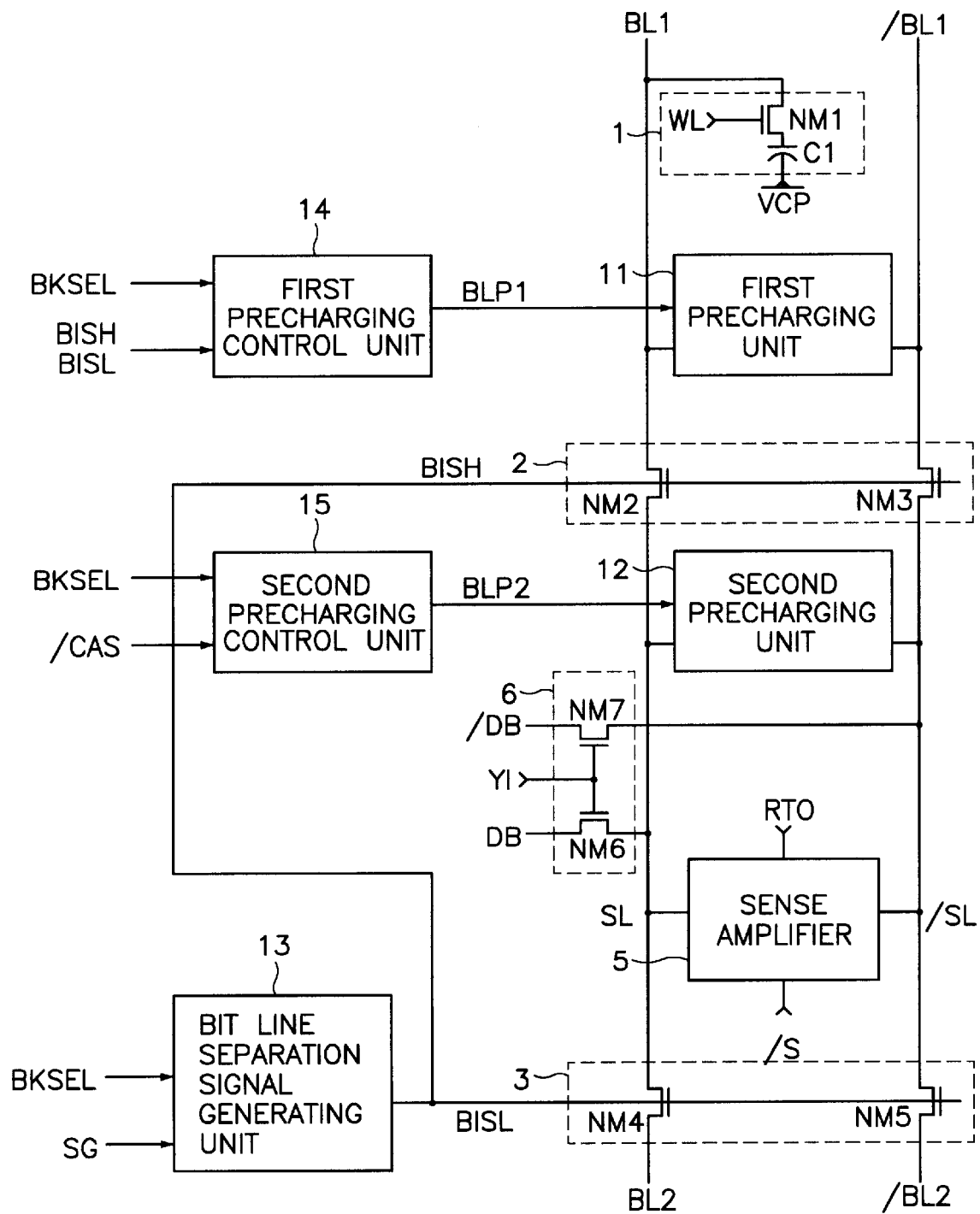
FIG. 3 is a circuit diagram illustrating a structure of a DRAM in accordance with the present invention.

FIG. 3 is a circuit diagram illustrating a DRAM structure in accordance with the present invention. As shown, the DRAM comprises a unit memory cell consisted of a NMOS transistor NM1 and a cell capacitor C1 which store data and which are connected between a first one side bit line BL1 and a cell plate voltage terminal VCP; a first line connecting unit 2 consisted of second and third NMOS transistors (NM2, NM3) responsive to a bit line separating signal BISH for connecting or disconnecting the first bit lines (BL, /BL1) and sense amplifier lines (SL, /SL); a second line connecting unit 3 consisted of fourth and fifth NMOS transistors (NM4, NM5) responsive to a bit line separating signal BISL for connecting or disconnecting second bit lines (BL2, /BL2) and sense amplifier lines (SL, /SL); first and second precharging units (11, 12) for equalizing and precharging the first bit lines (BL1, /BL1) and the sense amplifier lines (SL, /SL) under a control by the first and second bit line precharging control signals (BLP1, BLP2) respectively; a bit line sense amplifier 5 connected between the sense amplifier lines (SL, /SL) for performing a bit line sensing operation in accordance with sense amplifier control signals (RTO, /S); and a data bus line connecting unit 6 consisted of sixth and seventh NMOS transistors (NM6, NM7) for connecting or disconnecting the sense amplifier lines (SL, /SL) and the data bus lines (DB, /DB).

The first and second bit line separating signals (BISH, BISL) are generated from a bit line separating signal generating unit 13 in accordance with a bank selection signal BKSEL and a sensing generating signal SG applied thereto.

The first bit line equalizing/precharging control signal BLP1 is generated from a first precharging control unit 14 in accordance with the bank selection signal BKSEL and the first and second bit line separation signals (BISH, BISL) applied thereto.

The second bit line equalizing/precharging control signal BLP2 is generated from a second precharging control unit 15 in accordance with the bank selection signal BKSEL and a /CAS signal.

Here, constitutional elements identical to that of the conventional DRAM are represented by the same reference numbers.

Figure 4:
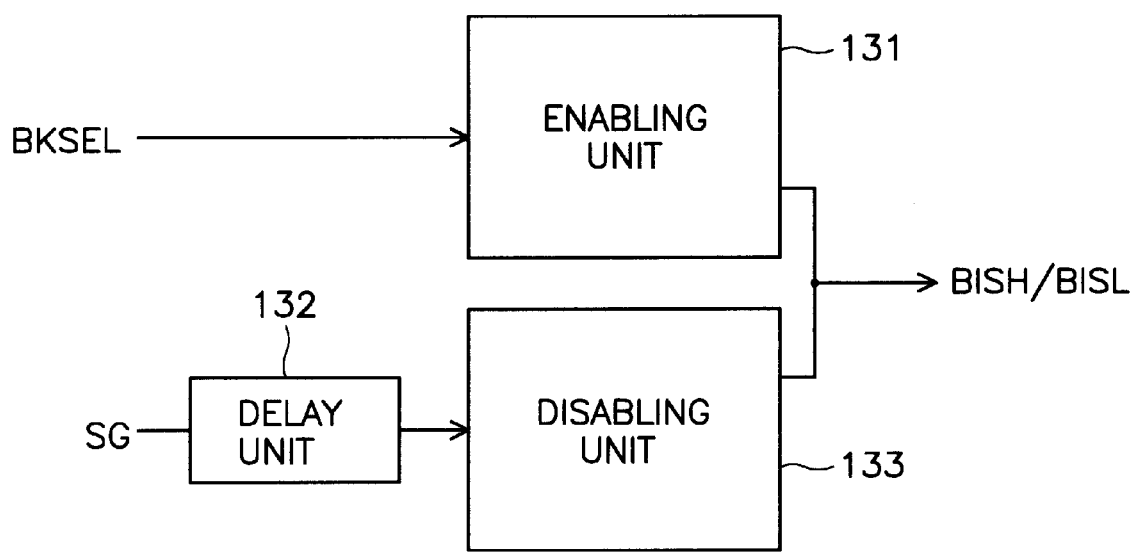
FIG. 4 is a block diagram illustrating a bit line separating signal generating unit as shown in FIG. 3.

FIG. 4 is a block diagram illustrating the bit line separation signal generating unit 13 as shown in FIG. 3. As shown, the bit line separation signal generating unit 13 includes an enabling unit 131 for enabling the bit line separation signals (BISH, BISL) upon receipt of the bank selection signal BKSEL generated in accordance with a /RAS signal; a delay unit 132 for delaying for a predetermined time the sense generation signal SG generating the sense amplifier control signals (RTO, /S); and a disabling unit 133 for disabling the bit line separation signals (BISH, BISL) using the sense generation signal SG delayed by the delay unit 132.

At this time, the predetermined time of the delay unit 132 may be controlled by modifying the number of inverters and connecting in serial them so as to be a minimum time required for separating enough the bit lines (BL1, /BL1) so that data can be rewritten on the memory sell.

Also, by fully swing the potential level of the bit line separation signals (BISH, BISL) from a ground voltage VSS to a high voltage VPP, the signals (BISH, BISL) may be controlled so that the first bit lines (BL1, /BL1) within the cell region and the sense amplifier lines (SL, /SL) within the sense amplifier region can be completely separated.

Figure 5:
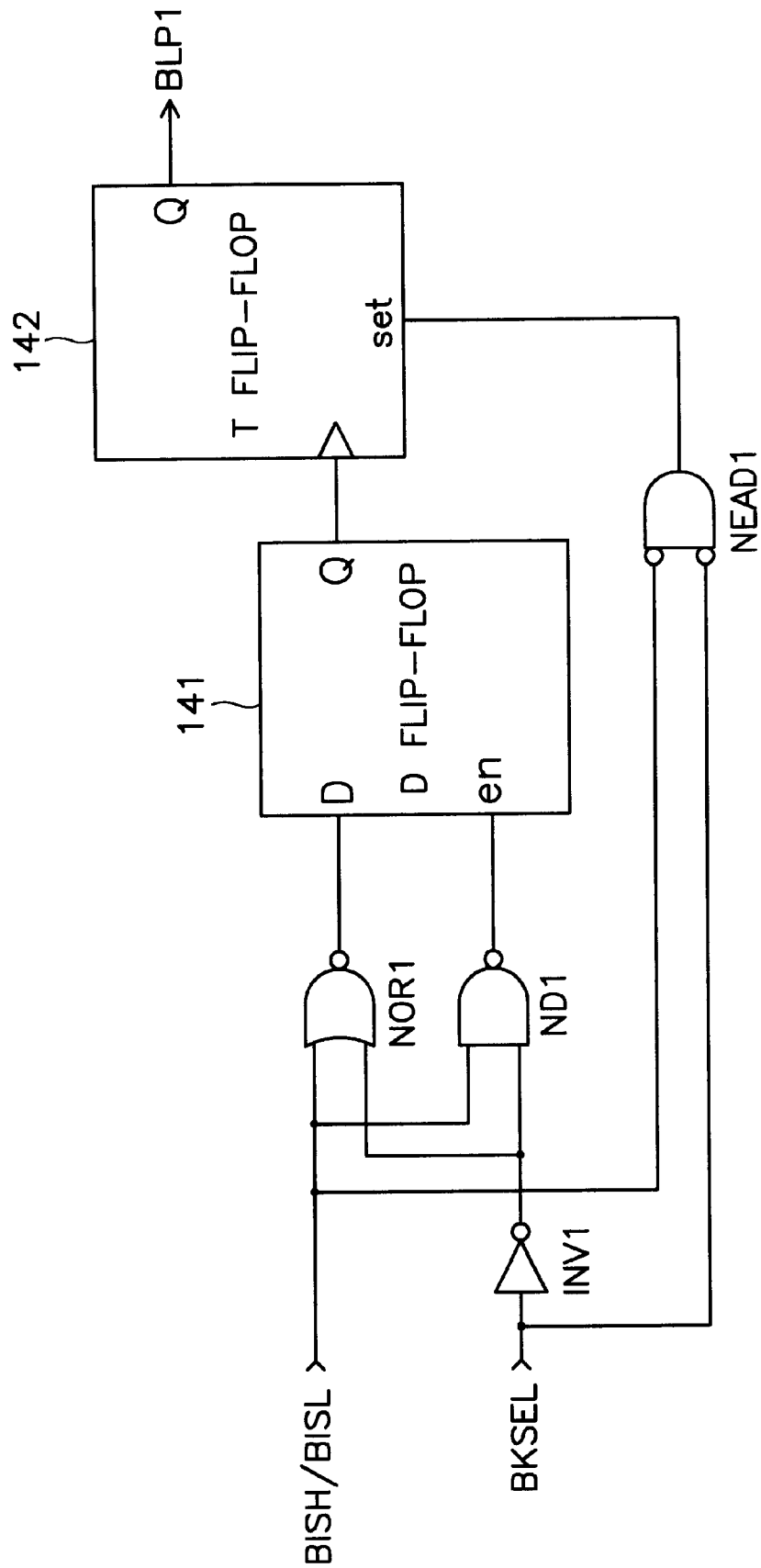
FIG. 5 is a circuit diagram showing an embodiment of a first precharging control unit as shown in FIG. 4.
Figure 6:
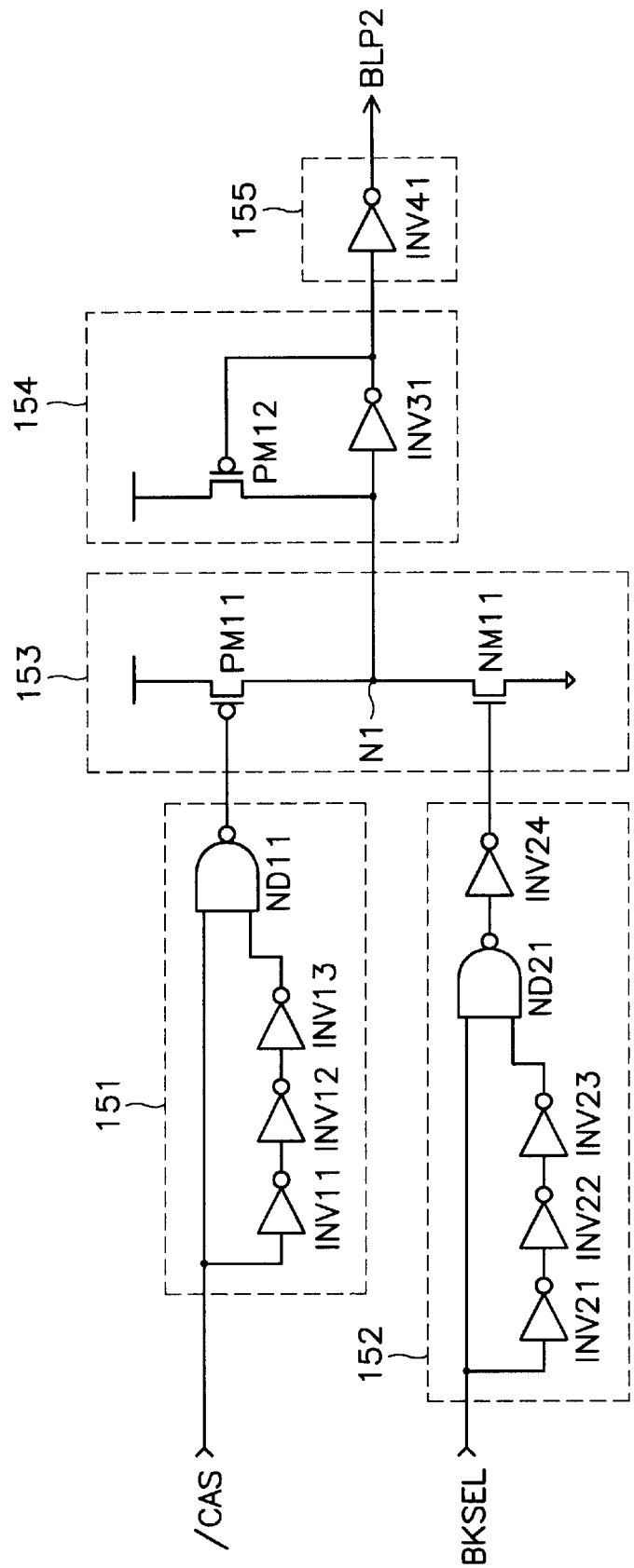
FIG. 6 is a circuit diagram showing an embodiment of a second precharging control unit as shown in FIG. 4.

FIG. 5 is a circuit diagram illustrating an embodiment of the first precharging control unit 14 as shown in FIG. 3. As shown, the first precharging control unit 14 includes a first inverter INV1 for inverting the bank selection signal BKSEL applied thereto; a NOR gate NOR1 for NORing the bit line separation signals (BISH, BISL) and the output signal of the inverter INV1; a NAND gate ND1 for NANDing the bit line separation signals (BISH, BISL) and the output signal of the inverter INV1; a D Flip-Flop 141 for receiving the output signal of the NAND gate ND1 to a clock input terminal CP and the output signal of the NOR gate NOR1 to a data input terminal D and for latching the signals for a predetermined time; a negative AND gate NEAD1 for receiving the respective inverted signals of the bank selection signal BKSEL and the bit line separation signals (BISH, BISL) and ANDing them; and a T Flip-Flop 142 being set by the output signal of the negative AND gate NEAD1 and generating the first precharging control signal BLP1 by toggling in accordance with the output signal Q of the D Flip-Flop 141.

The precharging control unit 14 having the above configuration disenables the first precharging unit 11 in response to the bank selection signal BKSEL and generates the first precharging control signal BLP1 so as to be enabled when the bit line separating signals (BISH, BISL) becomes disabled.

Now, an operation of the first precharging control unit 14 will be described in detail in reference to the drawing.

First, when the bank selection signal BKSEL and the bit line separation signals (BISH, BISL) are in a logic low level, the control signal BLP1 becomes at a high level. At this time, if the output of the D Flip-Flop 141 is in a logic high level, the T Flip-Flop 142 toggles and makes the output control signal BLP1 at a logic low level.

In this state, even if the bit line separation signals (BISH, BISL) is enabled to a logic high level, there is no change in the potential level of the output control signal BLP1 since the input terminal of the T Flip-Flop is maintained at a logic low level.

Thereafter, if the bit line separation signal falls a logic low level, the output signal of the D Flip-Flop 141 is shifted to a logic high level and thus the control signal outputted last is again risen to a logic high level.

FIG. 5 is a circuit diagram illustrating an embodiment of the second precharging control unit 15 as shown in FIG. 3. As shown, the second precharging control unit 15 includes first and second pulse generating unit (151), 152) for generating pulse signals respectively using a /CAS signal and a bank selection signal BKSEL; an output driving unit 153 being switched by the respective pulse control signals generated from the first and second pulse output terminal N1; a latch unit 154 for the potential of the output terminal N1; and a buffer unit 155 for buffering the output potential of the latch unit 154.

The first pulse generating unit 151 includes an odd number of inverters (INV11, INV12, INV13) connected in serial so as to inverted-delay the /CAS signal and a NAND gate ND11 for NANDing the output signal of the last inverter INV13 and the /CAS signal. Herein, three inverters are used for an illustrative description.

In addition, the second pulse generating unit 152 includes an odd number of inverters (INV21, INV22, INV23) connected in serial so as to inverted-delay the bank selection signal BKSEL; a NAND gate ND21 for NANDing the output signal of the last inverter INV23 and the bank selection signal BKSEL; and an inverter INV24 for inverting the output signal of the NAND gate ND21.

Also, the output driving unit 153 includes a PMOS transistor PM11 and a NMOS transistor NM11 which have their respective gates receiving pulse signals generated from the first and second pulse generating units (151, 152) and which are connected in serial between the power supply voltage VCC and the ground voltage VSS.

Further, the latch unit 154 includes an inverter INV13 for inverting the potential of the output terminal N1, and a PMOS transistor PM12 for performing feedback the output signal of the inverter INV31 and which the power supply voltage VCC applying to its source terminal, which its drain terminal connecting to the output terminal N1 and which the output signal of the inverter INV31 applying to its gate terminal. The buffering unit 155 includes an inverter INV41. Of course, the buffering unit 155 can be consisted of a plurality of inverters connected in serial.

The second precharging control unit 15 having the above described configuration disables at a logic low level the control signal BLP2 outputted last by the bank selection signal BKSEL which is generated in accordance with the /RAS signal and again disables at a logic high level the output control signal BLP2 when the /CAS signal is shifted from a logic low level to a logic low level and thusly disabled.

FIG. 7(a) through 7(j) are timing diagrams illustrating a DRAM operation in accordance with the present invention which will be described in detail below.

First, the bit line separation signal generating unit 13 receives a bank selection signal BKSEL generated in accordance with the /RAS signal as shown in FIG. 7(a) and thusly enables the bit line separation signals (BISH, BISL) as shown in FIG. 7(c). Then, the bit line separation signal generating unit 13 disables the bit line separation signals (BISH, BISL) upon receipt of a sense generation signal SG which generates sense amplifier operation control signals (RTO, /S) as shown in FIG. 7(i) and which is delayed during a predetermined time (a minimum time required for separating enough the bit lines so that data can be rewritten in the memory cell) through the delay unit 142.

Also, the bit line separation signal generating unit 13 allows the first bit lines (BL1, /BL1) within the cell region and the sense amplifier lines (SL, /SL) to be separated completely by fully swinging the bit line separating signals (BISH, BISL) from the ground voltage VSS level to the high voltage VPP level.

At this time, as described above, the bit line separation signals (BISH, BISL), which are controlled as to whether it should be enabled or not, are outputted at a disabled state and thus the first line connecting unit 2 is turned-off, thereby allowing the first bit lines (BL1, /BL1) within the memory cell region and the sense amplifier lines (SL, /SL) within the sense amplifier region to be completely separated. As a result, the sense amplifier lines (SL, /SL) within the sense amplifier region are activated as shown in FIG. 7(h). Accordingly, when performing a column operation, by precharging at a predetermined potential (for example, VDD/2) the first bit lines (BL1, /BL1) within the memory region as shown in FIG. 7(f) and thusly allowing the wordline WL to be disabled as shown in FIG. 7(d), the memory cell region comes to the ready to enable a new wordline WL.

Accordingly, it becomes possible to reduce a time (RAS to RAS) taken to generate again the next RAS signal after a RSA signal was generated. Also, since after a time tRCD taken until a CAS signal is generated after generation of the second RAS signal, it is possible to generate again the next CAS signal, the time (CAS to CAS) taken until the next CAS signal after a CAS signal was generated can be also reduced. As a result, data access time can be greatly reduced thereby realizing a high-speed operation.

Figure 1:
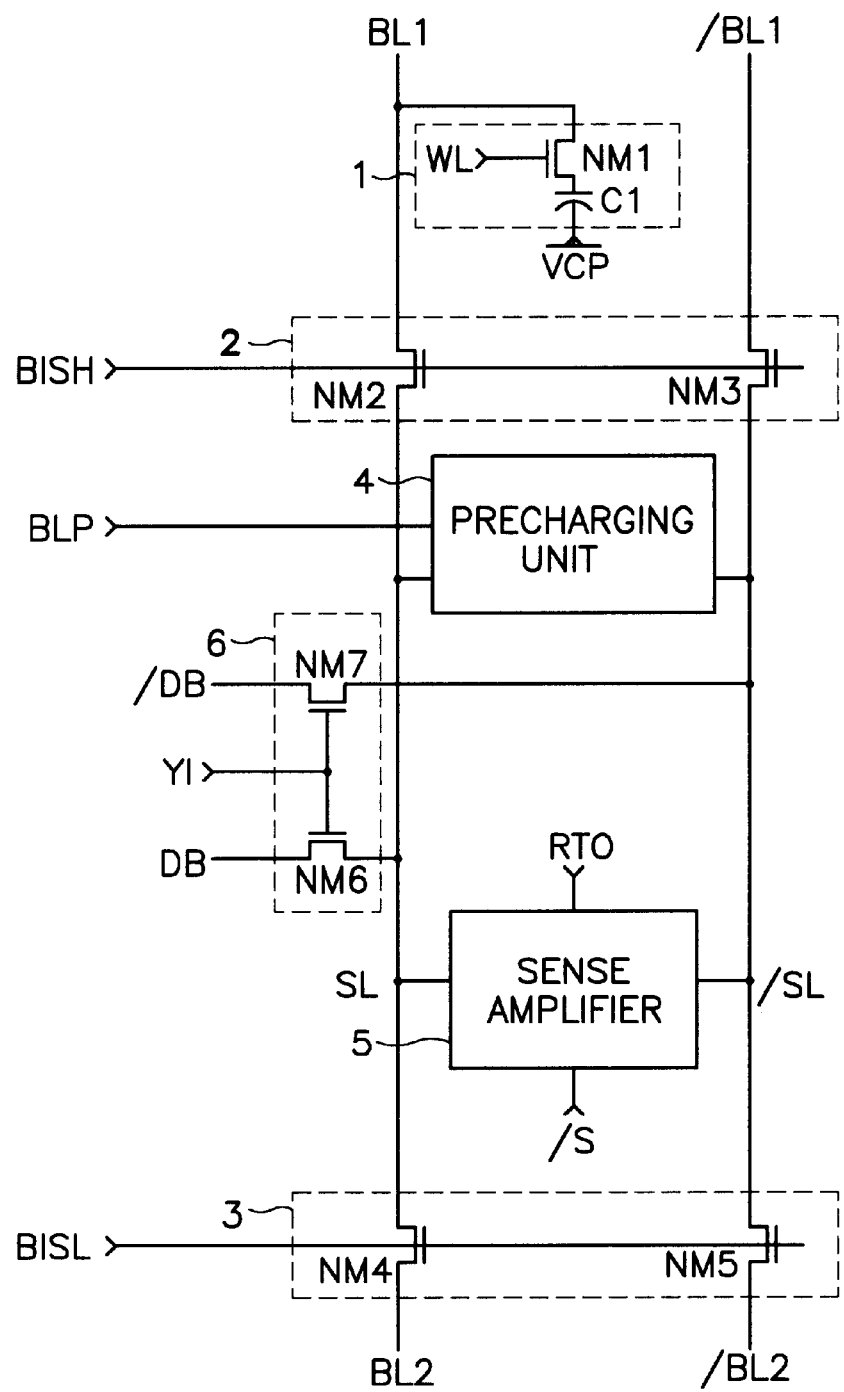
FIG. 1 is a circuit diagram illustrating a structure of a DRAM in accordance with a conventional art.
Figure 2:
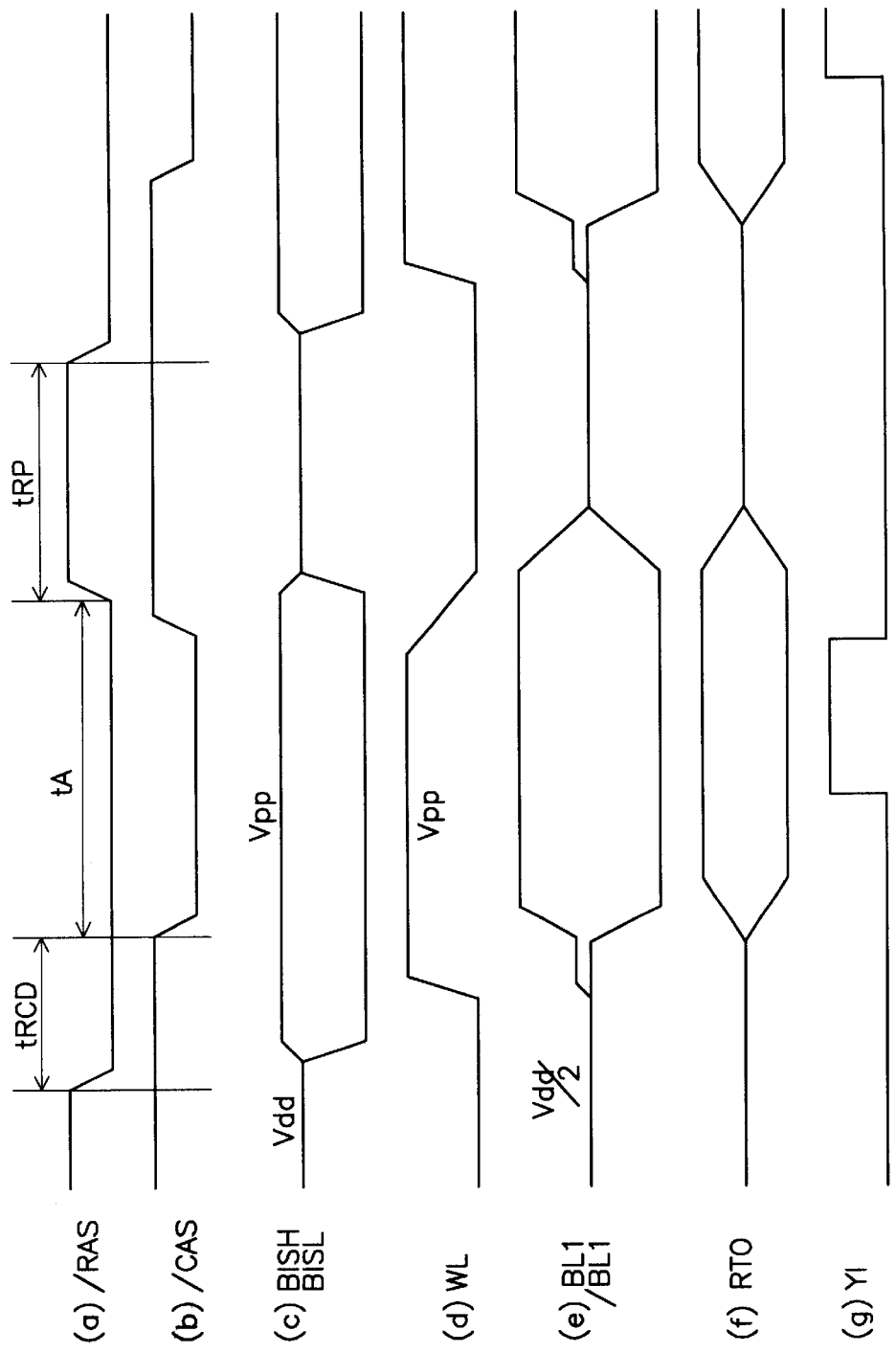
FIG. 2 is a driving timing diagram of the conventional DRAM structure of FIG. 1.
Figure 7:
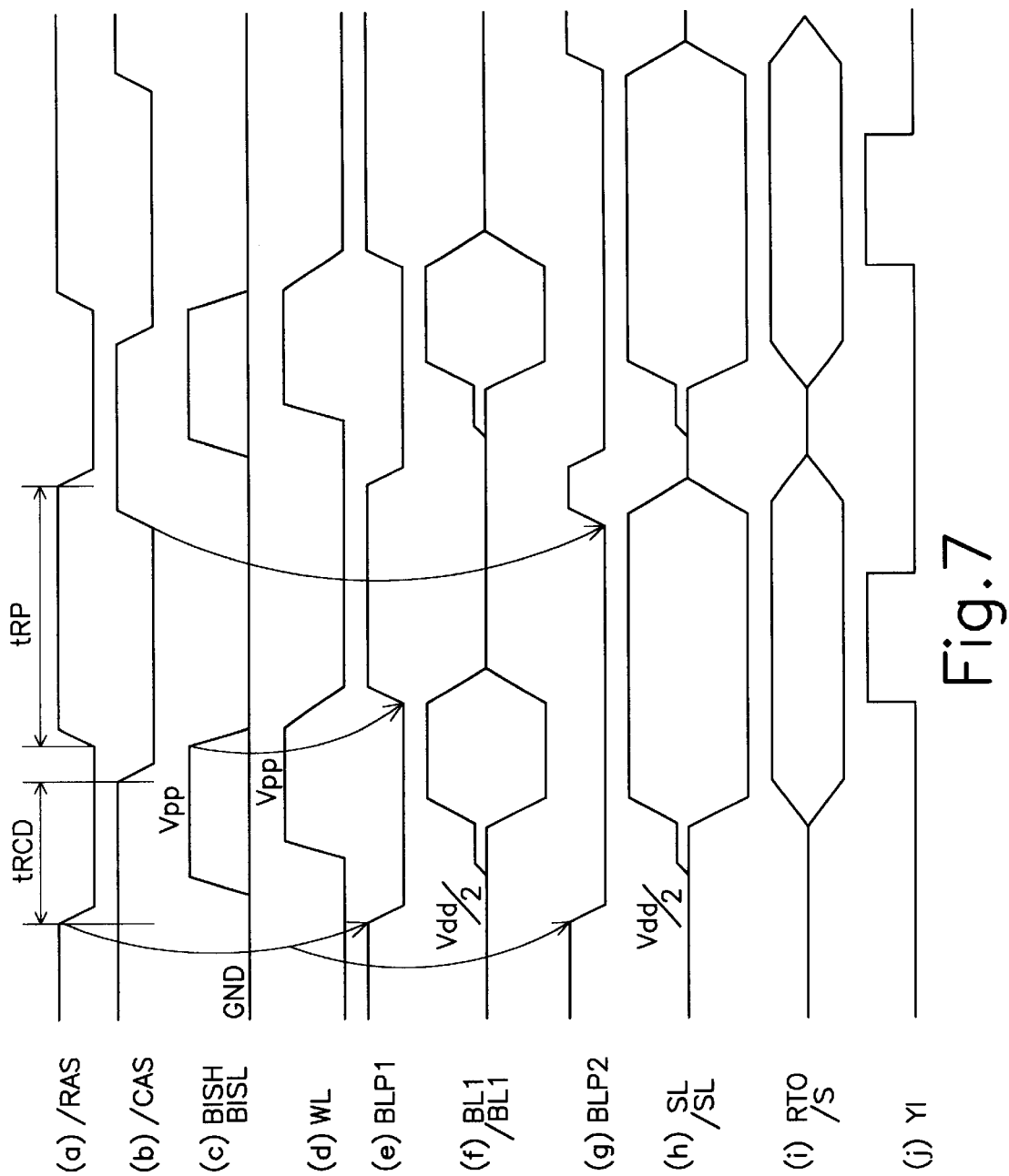
FIG. 7 is a driving timing diagram of the DRAM in accordance with the present invention.

The driving timing diagram as shown in FIG. 7 is depicted to have the time scale identical to that of the driving time diagram of FIG. 2. As can be seen, the data access time can be greatly reduced compared to that of the conventional art.

As described above, since the DRAM structure in accordance with the present invention comprises separately bit lines within the memory cell region and bit lines within the sense amplifier region, the row and column operation timing can be reduced. Accordingly, the data access time can be greatly reduced, thereby realizing a high-speed operation.

Although the foregoing preferred embodiment of the present invention has been disclosed for illustrative purpose, those skilled in the art will appreciate that various modifications, additions and substitutions are possible, without departing from the scope and spirit of the invention as recited in the appended claims.

What is claimed is:

1. In a semiconductor memory device comprising:
   a unit memory cell;
   a first line connecting means responsive to a first bit line separating signal for connecting or disconnecting bit lines within the unit memory cell region and bit lines within a sense amplifier region;
   a second line connecting means responsive to a second bit line separating signal for connecting or disconnecting bit lines within an other unit memory cell region and bit lines within the sense amplifier region;

a first precharging means for equalizing and precharging the bit lines within the sense amplifier region under a control by a first precharging control signal;

a bit line sense amplifier connected between the bit lines within the sense amplifier region for performing a bit line sensing operation under a control by sense amplifier control signals; and a data bus line connecting means responsive to a column selecting signal for connecting or disconnecting the bit lines within the sense amplifier region and data bus lines being characterized in that:

said semiconductor memory device further includes a second precharging means for equalizing and precharging said bit lines within the unit memory cell region under a control by a second precharging control signal;

wherein said first and second bit line separating signals are generated from a bit line separating signal generating means in accordance with a bank selecting signal and a sensing generating signal;

said first bit line precharging control signal is generated from a first precharging control means in accordance with said bank selecting signal and said first and second bit line separating signals; and said second bit line precharging control signal is generated from a second precharging control means in accordance with said bank selecting signal and a /CAS signal.

2. A semiconductor memory device according to claim 1, wherein said bit line separation signal generating means includes:

an enabling means for enabling said bit line separation signals upon receipt of said bank selection signal generated in accordance with a /RAS signal;

a delay means for delaying for a predetermined time the sensing generating signal generating said sense amplifier control signals; and a disabling means for disabling the bit line separation signals using the sense generation signal.

3. A semiconductor memory device according to claim 2, wherein the predetermined time in said delay means is a time required for separating enough the bit lines so that data can be rewritten in the memory cell.

4. A semiconductor memory device according to claim 1, wherein said first precharging control means includes:

a first inverter for inverting said bank selection signal applied thereto;

a NOR gate for NORing said bit line separation signals and the output signal of said first inverter;

a NAND gate for NANDing said bit line separation signals and the output signal of said first inverter;

a D Flip-Flop for receiving the output signal of said NAND gate as a clock input and the output signal of said NOR gate as a data input and for latching the signals for a predetermined time;

a negative AND gate for receiving the respective inverted signals of said bank selection signal and said bit line separation signals and for ANDing them; and a T Flip-Flop setting by the output signal of said negative AND gate and generating said first precharging control signal by toggling in accordance with the output signal of said D Flip-Flop.

5. A semiconductor memory device according to claim 1, wherein said second precharging control means includes:

first and second pulse generating means for generating pulse signals respectively using said /CAS signal and said bank selection signal;

an output driving means being switched by said respective pulse control signals generated from said first and second pulse generating means and adjusting the potential of the output terminal;

a latch means for latching the potential of said output terminal; and a buffer means for buffering the output potential of said latch means.

6. A semiconductor memory device according to claim 5, wherein said first pulse generating means includes:

an odd number of inverters connected in serial for inverting and delaying said /CAS signal; and a NAND gate for combining the output signal of the last inverter of said inverters and said /CAS signal.

7. A semiconductor memory device according to claim 5, wherein said second pulse generating means includes:

an odd number of inverters connected in serial for inverting and delaying said bank selection signal;

a NAND gate for combining the output signal of the last inverter said inverters and said bank selection signal; and a inverter for inverting the output signal of said NAND gate.

8. A semiconductor memory device according to claim 5, wherein said output driving means includes:

a PMOS transistor and a NMOS transistor being connected in serial between a power supply voltage and a ground voltage and having their respective gates receiving pulse signals generated from said first and second pulse generating means.

9. A semiconductor memory device according to claim 5, wherein said latch means includes:

an inverter for inverting the potential of said output terminal; and a PMOS transistor being connected between a power supply voltage and said output terminal and having its gate terminal to which the output signal of said inverter is feedback.

* * * * *